United States Patent
Hill et al.

(10) Patent No.: US 11,933,717 B2
(45) Date of Patent: Mar. 19, 2024

(54) SENSITIVE OPTICAL METROLOGY IN SCANNING AND STATIC MODES

(71) Applicant: KLA Corporation, Milpitas, CA (US)

(72) Inventors: Andrew V. Hill, Berkeley, CA (US); Amnon Manassen, Haifa (IL); Yoram Uziel, Milpitas, CA (US); Yossi Simon, Milpitas, CA (US); Gilad Laredo, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 632 days.

(21) Appl. No.: 16/586,504

(22) Filed: Sep. 27, 2019

(65) Prior Publication Data

US 2021/0096061 A1   Apr. 1, 2021

(51) Int. Cl.
*G01N 21/17* (2006.01)
*G01B 11/25* (2006.01)
*G06T 7/00* (2017.01)

(52) U.S. Cl.
CPC .............. *G01N 21/17* (2013.01); *G01B 11/25* (2013.01); *G06T 7/0004* (2013.01); *G01N 2021/1736* (2013.01); *G06T 2207/30148* (2013.01)

(58) Field of Classification Search
CPC ........... G01N 21/17; G01N 2021/1736; G01N 21/4788; G01N 2201/08; G01N 21/9501;
(Continued)

(56) References Cited

U.S. PATENT DOCUMENTS 7,095,507 B1   8/2006   Hwang et al.
8,873,054 B2   10/2014  Kandel et al.
(Continued)

FOREIGN PATENT DOCUMENTS

DE   102008003996 A1   8/2008
EP      2425232 B1      1/2013
(Continued)

OTHER PUBLICATIONS

PCT International Search Report and Written Opinion for International Application No. PCT/US2020/051893 dated Dec. 17, 2020, 10 pages.
(Continued)

*Primary Examiner* — Richard A Hansell, Jr.
(74) *Attorney, Agent, or Firm* — Sulter Swantz pc llo

(57) ABSTRACT

A metrology system may include a metrology tool to selectively perform metrology measurements in a static mode in which one or more metrology targets on a sample are stationary during a measurement or a scanning mode in which one or more metrology targets are in motion during a measurement, and a controller communicatively coupled to the translation stage and at least one of the one or more detectors. The controller may receive locations of metrology targets on the sample to be inspected, designate the metrology targets for inspection with the static mode or the scanning mode, direct the metrology tool to perform metrology measurements on the metrology targets in the static mode or the scanning mode based on the designation, and generate metrology data for the sample based on the metrology measurements on the metrology targets.

32 Claims, 6 Drawing Sheets

(58) Field of Classification Search
CPC ... G01B 11/25; G01B 2210/56; G06T 7/0004; G06T 2207/30148; G03F 7/70616; H01L 22/12; H01L 22/20
See application file for complete search history.

(56) References Cited

U.S. PATENT DOCUMENTS

| | | | |
|---|---|---|---|
| 8,896,832 B2 | 11/2014 | Hill et al. | |
| 8,947,521 B1* | 2/2015 | Hill | H04N 23/69 |
| | | | 382/145 |
| 9,462,206 B2 | 10/2016 | Brown et al. | |
| 9,970,747 B2 | 5/2018 | Kreuzer et al. | |
| 10,048,132 B2 | 8/2018 | Hill et al. | |
| 10,203,247 B2 | 2/2019 | Brady et al. | |
| 10,345,095 B1 | 7/2019 | Pandev et al. | |
| 2003/0223630 A1* | 12/2003 | Adel | G03F 9/7011 |
| | | | 382/145 |
| 2009/0201494 A1* | 8/2009 | Furman | G01N 21/9501 |
| | | | 356/237.5 |
| 2012/0206729 A1 | 8/2012 | Seligson et al. | |
| 2012/0224183 A1* | 9/2012 | Fay | G01B 11/2441 |
| | | | 356/491 |
| 2012/0307021 A1 | 12/2012 | Tsai et al. | |
| 2013/0100427 A1* | 4/2013 | Koolen | G03F 9/70 |
| | | | 356/614 |
| 2013/0265572 A1* | 10/2013 | Delgado | G02B 1/11 |
| | | | 427/523 |
| 2014/0158864 A1* | 6/2014 | Brown | H04N 25/768 |
| | | | 250/208.1 |
| 2014/0240951 A1* | 8/2014 | Brady | G01J 3/12 |
| | | | 362/583 |
| 2014/0300726 A1 | 10/2014 | Gladnick | |
| 2016/0116848 A1 | 4/2016 | Mulder et al. | |
| 2017/0013185 A1* | 1/2017 | Gladnick | G02B 3/0087 |
| 2017/0023358 A1* | 1/2017 | Lee | G03F 7/70683 |
| 2017/0090302 A1* | 3/2017 | Slotboom | G03F 7/70633 |
| 2017/0350575 A1* | 12/2017 | Hill | G01J 3/12 |
| 2018/0064399 A1* | 3/2018 | Buettgen | A61B 5/02416 |
| 2018/0091751 A1* | 3/2018 | Brown | G02B 26/128 |
| 2018/0335346 A1 | 11/2018 | Hill et al. | |
| 2019/0228518 A1* | 7/2019 | Manassen | G03F 9/7049 |
| 2019/0316900 A1* | 10/2019 | Muthinti | G01B 11/272 |

FOREIGN PATENT DOCUMENTS

| | | | | |
|---|---|---|---|---|
| TW | 201248515 A | | 12/2012 | |
| WO | 2019018488 A1 | | 1/2019 | |
| WO | WO-2019143371 A1 * | | 7/2019 | ............ G01B 11/00 |

OTHER PUBLICATIONS

Sousa, Andre R., Metrological evaluation of a Coordinate Measuring Machine with 5-axis measurement technology, ScienceDirect, Procedia CIRP 75 (2018), pp. 367-372, www.sciencedirect.com.

Van Oorschot, Peter et al., "Performance of an I-Line Step & Scan System for Sub 0.25 μm Mix and Match Applications", This paper was presented at the SPIE Symposium on Optical Microlithography, Santa Clara, Feb. 1998, pp. 1-14.

* cited by examiner

SENSITIVE OPTICAL METROLOGY IN SCANNING AND STATIC MODES

TECHNICAL FIELD

The present disclosure is related generally to optical metrology and, more particularly, to optical metrology in scanning and static modes.

BACKGROUND

Metrology systems typically generate metrology data associated with a sample by measuring or otherwise inspecting dedicated metrology targets distributed across the sample. Further, different metrology tools may be designed to inspect metrology targets using different techniques. For example, some metrology tools may be designed to inspect a metrology target while the target is static within a field of view. Such tools may thus inspect multiple metrology targets across a sample using a move-and-measure (MAM) mode of operation in which the sample is translated to place a metrology target of interest within a measurement field of view, a measurement is taken while the sample is static, and the sample is then translated to place an additional metrology target of interest in the measurement field of view. By way of another example, some metrology tools may be designed to inspect a metrology target while the sample is in motion (e.g., a scanning mode of operation).

Increasing demands for smaller semiconductor devices is resulting in corresponding increased demand for accurate and efficient metrology. However, metrology tools having dedicated MAM or scanning modes may provide inefficient inspection of metrology targets distributed across a sample.

Additionally, regardless of the operational mode, metrology tools may inspect a particular metrology target using one or more optical configurations (e.g., illumination spectra, polarization, or the like) and generate metrology data based on the combined inspections to achieve a desired measurement sensitivity. However, variations in measurement conditions between inspections with different optical configurations may limit the achievable measurement sensitivity.

It is therefore desirable to provide systems and methods that cure the above deficiencies.

SUMMARY

A metrology system is disclosed in accordance with one or more illustrative embodiments of the present disclosure. In one illustrative embodiment, the system includes a metrology tool configured to selectively perform metrology measurements in a static mode in which one or more metrology targets on a sample are stationary during a measurement or a scanning mode in which one or more metrology targets are in motion during a measurement. In another illustrative embodiment, the system includes a controller communicatively coupled to the translation stage and at least one of the one or more detectors. In another illustrative embodiment, the controller receives locations of metrology targets on the sample to be inspected. In another illustrative embodiment, the controller designates the metrology targets for inspection with the static mode or the scanning mode. In another illustrative embodiment, the controller directs the metrology tool to perform metrology measurements on the metrology targets in the static mode or the scanning mode based on the designation. In another illustrative embodiment, the controller generates metrology data for the sample based on the metrology measurements on the plurality of metrology targets.

A metrology method is disclosed in accordance with one or more illustrative embodiments of the present disclosure. In one illustrative embodiment, the method includes receiving locations of metrology targets on a sample to be inspected. In another illustrative embodiment, the method includes designating the metrology targets for inspection with a static mode in which one or more metrology targets on the sample are stationary during a measurement or a scanning mode in which one or more metrology targets are in motion during a measurement. In another illustrative embodiment, the method includes directing the metrology tool to perform metrology measurements on the metrology targets in the static mode or the scanning mode based on the designation via one or more drive signals. In another illustrative embodiment, the method includes generating metrology data for the sample based on the metrology measurements on the metrology targets.

A metrology system is disclosed in accordance with one or more illustrative embodiments of the present disclosure. In one illustrative embodiment, the system includes a multi-channel imaging sub-system. In another illustrative embodiment, the multi-channel imaging sub-system includes an illumination source. In another illustrative embodiment, the multi-channel imaging sub-system includes one or more illumination optics to direct illumination from the illumination source to a sample. In another illustrative embodiment, the multi-channel imaging sub-system includes one or more collection optics to collect light emanating from the sample in response to the illumination from the illumination source. In another illustrative embodiment, the multi-channel imaging sub-system includes a detector to generate two or more images of the sample in an exposure window. In another illustrative embodiment, the system includes a controller communicatively coupled to the detector. In another illustrative embodiment, the controller generates one or more drive signals for at least one of the illumination source, the one or more illumination optics, the one or more collection optics, or the detector to sequentially provide N optical configurations of the multi-channel imaging sub-system within the exposure window of the detector, where N is selected integer greater than one. In another illustrative embodiment, the detector generates N images of the sample during a readout phase associated with the exposure window, where a particular image of the N images corresponds to a particular optical configuration of the N optical configurations. In another illustrative embodiment, the controller generates metrology data associated with the sample based on the N images of the sample.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1:
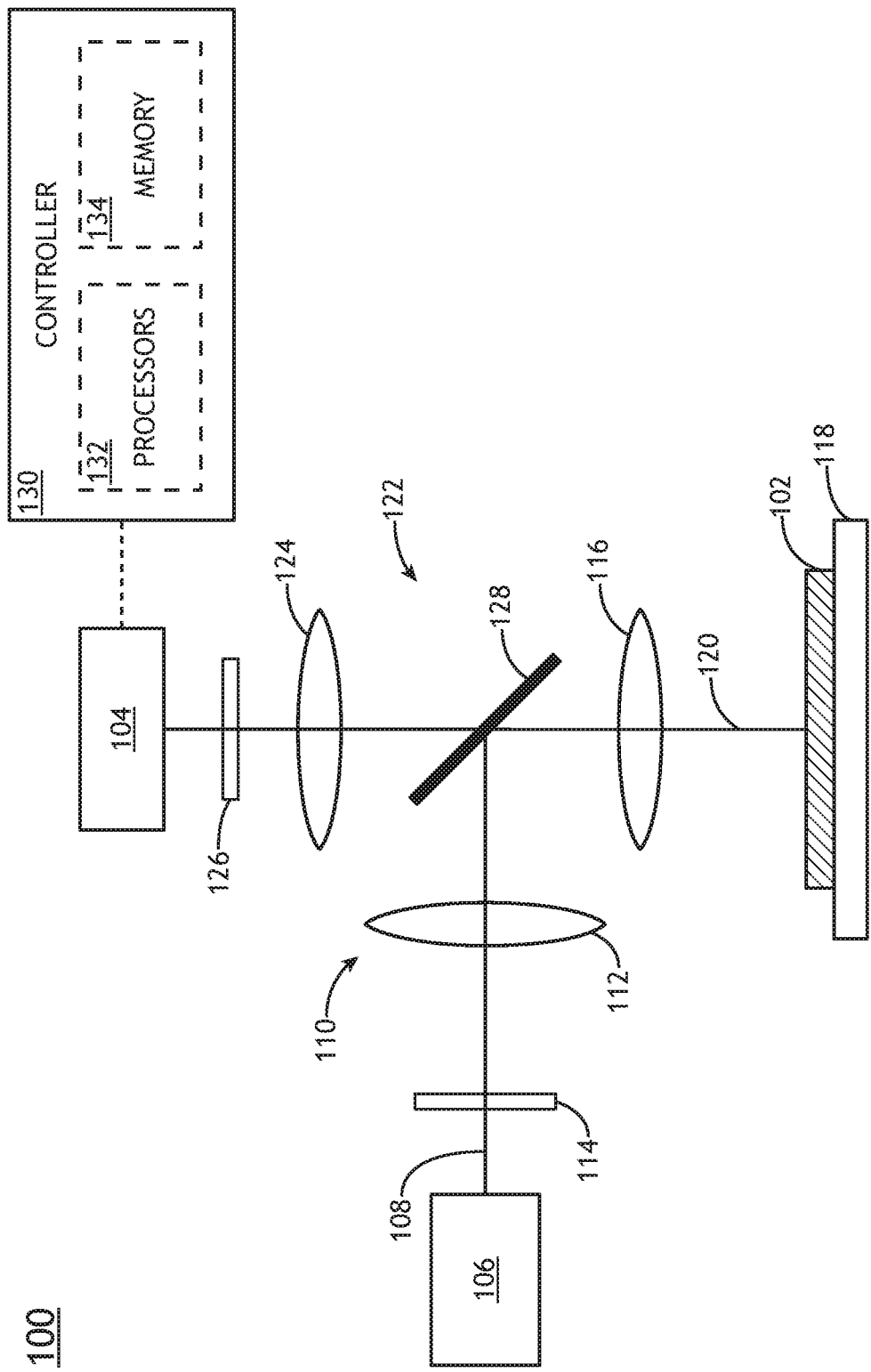
FIG. 1 is a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for high-throughput and high-sensitivity optical metrology.

Some embodiments of the present disclosure are directed to optical metrology using dynamically selectable operational modes. For example, a metrology system may be capable of both a static (e.g., MAM) operational mode for measurements of metrology targets while a sample is static and a scanning operational mode for measurements of metrology targets while a sample is in motion.

A static mode may consist of translating the sample until a metrology target is placed within a measurement field of view, waiting for the position of the sample to settle, performing a measurement (e.g., generating an image, or the like), translating the sample to place a new metrology target within the measurement field of view, and repeating the process. In contrast, a scanning mode may consist of translating the sample to a desired start location, scanning the sample along a controlled path including one or more metrology targets during a measurement to reach a desired end location, translating the sample to a new start location, and repeating the process.

It is recognized herein that the efficiency of inspection using static and scanning modes may depend on the particular layout and type of metrology targets on a sample. For example, a scanning mode of operation may be well-suited for, but not limited to, cases where multiple metrology targets are closely spaced along a line. Such a configuration is common, for example, in intra-die locations (e.g., die streets) of a semiconductor sample. In this regard, a constant scan provided by a scanning mode may efficiently inspect multiple targets. By way of another example, a static mode may be well-suited for, but not limited to, cases where metrology targets are sparsely distributed across a wafer and/or are not distributed in regular patterns suitable for line scans.

Additional embodiments of the present disclosure are directed to designating or otherwise selecting which mode of operation to use for particular metrology targets distributed across a sample. It is recognized herein that a distribution of metrology targets across a single sample may include some areas well-suited for static mode inspection and other areas well-suited for scanning mode inspection. Accordingly, designating certain metrology targets for static mode inspection and others for scanning mode inspection may facilitate high-throughput inspection of the sample as a whole.

In some embodiments, a metrology system receives locations of multiple metrology targets distributed across a sample and designates each of the metrology targets for inspection with a selected mode (e.g., static or scanning). The metrology system may use a variety of metrics to determine which mode to use for a particular target. For example, the metrology system may make a designation based on a target type, target location, a proximity to one or more additional metrology targets of the plurality of metrology targets, or target density. Further, the metrology system may make a designation based on a weighted function in which multiple metrics are provided relative weights.

Some embodiments of the present disclosure are directed to rapidly generating multiple measurements of a metrology target using multiple optical configurations within a single exposure window of a detector. It is recognized herein that optical metrology systems typically generate one or more images of a sample that may be analyzed to determine a metrology measurement of interest (e.g., an overlay metrology measurement, a critical dimension (CD) measurement, a sidewall angle (SWA) measurement, identification of a defect, or the like). In this regard, a metrology system may typically include a detector located at field plane (e.g., a plane conjugate to the sample to generate an image of one or more features on the sample), a pupil plane (e.g., to generate a pupil image associated with angles at which light emanates from the sample), or both.

Additionally, it may be advantageous to generate multiple images of a particular optical target with different optical configurations. For the purposes of the present disclosure, an optical configuration may include a particular set of illumination, collection, or imaging parameters used to generate an image. For example, an optical configuration may include, but is not limited to, a spectrum of an illumination beam, a spectrum of light collected from the sample used to generate an image, a polarization of an illumination beam, a polarization of light collected from the sample used to generate an image, a location of an image plane relative to a surface of a sample, an open diameter of one or more stops or pupils (e.g., field stops, aperture stops, or the like), a location of one or more stops or pupils (e.g., which may be used to adjust telecentricity), or detector settings (e.g., gain, exposure time, or the like).

The image quality associated with a particular metrology target may depend on the interplay between the imaging system and the characteristics of the particular metrology target. For example, the absorption, reflection, diffraction, and/or scattering of light from a metrology target may vary based on the composition, size, and layout of features in a metrology target as well as the wavelength and polarization of an illumination beam.

Multiple images of a target generated using different optical configurations may be utilized in various ways to achieve a desired level of performance (e.g., a desired sensitivity, signal to noise ratio (SNR), a desired image contrast, or the like). For example, generating multiple images of a target using different optical configurations may facilitate selection of a particular optical configuration (e.g., in a processing step) for each metrology that generated an image having an image quality within a selected specification. By way of another example, an algorithm for generating a metrology measurement may incorporate multiple sample images generated with a known set of different optical configurations.

It is further recognized herein that it is typically desirable to generate images with different optical configurations under the same conditions. However, metrology systems typically include time-varying sources of error that result in variations of the optical configuration over time. For example, the spectrum or the beam profile of an illumination beam may exhibit temporal jitter or drift. By way of another example, a translation stage securing a sample may similarly exhibit temporal jitter or drift. Such temporal sources of error may be particularly problematic for systems utilizing multiple images generated using different optical configurations, where differences between the images attributed to system-level variations may manifest as measurement error associated with the sample.

Accordingly, some embodiments of the present disclosure are directed to forming images with multiple optical configurations within a common exposure window. For example, the metrology system may rapidly switch between different optical configurations.

For example, a typical metrology system may generate an image by exposing a sample with a given optical configuration and correspondingly exposing the pixels of a detector during an exposure window. The typical metrology system may then read out the charge stored to form an image associated with the given optical configuration.

In embodiments of the present disclosure, a metrology system may generate multiple images of a sample using different optical configurations in a single exposure window by rapidly altering the optical configuration during the exposure window and generating multiple images associated with the different optical configurations in a common readout phase. In this regard the time duration between images of the sample associated with the different optical configurations may be substantially minimized. Accordingly, time-varying sources of error may impact each of the different images in substantially the same manner.

In some embodiments, a metrology system includes a scanning sensor such as, but not limited to, a line sensor or a time delay integration (TDI) sensor to generate a continuous output image (e.g., a strip image) as a sample is translated through a measurement field. Accordingly, a metrology system configured in accordance with the present disclosure may sequentially cycle through different optical configurations and synchronize the translation speed of the sample with the clock rate of the scanning sensor such that each pixel row corresponds to a different optical configuration. In this regard, the output image may be composed of interleaved images, each associated with a different optical configuration. The output image may then be split into multiple separate images in a post-processing step.

In some embodiments, a metrology system includes a static multi-tap imaging sensor. In this regard, each pixel may include two or more taps, where charge stored in the pixel may be directed to any of the taps through drive signals. A metrology system configured in accordance with the present disclosure may sequentially cycle through different optical configurations and synchronize the drive signals of the pixels to direct charge associated with the different optical configurations to dedicated taps during the exposure window. Multiple images from the multiple taps may then be generated during a subsequent readout phase.

Referring now to FIGS. 1 through 5B, systems and methods for efficient and sensitive metrology are described in greater detail.

FIG. 1 is a block diagram view of a metrology system 100, in accordance with one or more embodiments of the present disclosure. The metrology system 100 may generate one or more images of a sample 102 on at least one detector 104 using any method known in the art. In one embodiment, the detector 104 is located at a field plane to generate an image of one or more features on the sample 102. In another embodiment, the detector 104 is located at a pupil plane to generate an image based on angles of light emanating from the sample 102 (e.g., based on reflection, diffraction, scattering, or the like). In this regard, the metrology system 100 may operate as a scatterometry-based metrology tool.

In one embodiment, the metrology system 100 includes an illumination source 106 to generate an illumination beam 108. The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum.

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like).

In another embodiment, the illumination source 106 directs the illumination beam 108 to a sample 102 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 102 and/or field stops to control the spatial extent of illumination on the sample 102. In one instance, the illumination pathway 110 includes an aperture stop located at a plane conjugate to the back focal plane of the objective lens 116 to provide telecentric illumination of the sample. In another embodiment, the metrology system 100 includes an objective lens 116 to focus the illumination beam 108 onto the sample 102.

In another embodiment, the sample 102 is disposed on a sample stage 118. The sample stage 118 may include any device suitable for positioning the sample 102 within the metrology system 100. For example, the sample stage 118 may include any combination of linear translation stages, rotational stages, tip/tilt stages or the like.

In another embodiment, a detector 104 is configured to capture radiation emanating from the sample 102 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 102 or generated by the sample 102 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of an optical element the objective lens 116 to provide telecentric imaging of the sample.

The detector 104 may include any type of optical detector known in the art suitable for measuring illumination received from the sample 102. For example, a detector 104 may include a sensor suitable for generating one or more images of a static sample 102 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. Further, the detector 104 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

By way of another example, a detector 104 may include a sensor suitable for generating one or more images of a sample 102 in motion (e.g., a scanning mode of operation). For instance, the detector 104 may include a line sensor including a row of pixels. In this regard, the metrology system 100 may generate a continuous image (e.g., a strip image) one row at a time by translating the sample 102 in a scan direction perpendicular to the pixel row through a measurement field of view and continuously clocking the line sensor during a continuous exposure window.

In another instance, the detector 104 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, a detector 104 may include a spectroscopic detector suitable for identifying wavelengths of radiation emanating from the sample 102. In another embodiment, the metrology system 100 may include multiple detectors 104 (e.g. associated with multiple beam paths generated by one or more beamsplitters to facilitate multiple metrology measurements by the metrology system 100. For example, the metrology system 100 may include one or more detectors 104 suitable for static mode imaging and one or more detectors 104 suitable for scanning mode imaging. In another embodiment, the metrology system 100 may include one or more detectors 104 suitable for both static and scanning imaging modes. For example, a TDI sensor may operate in a static mode by not clocking the TDI sensor to transfer charge between pixel rows during an exposure window. Then, once the exposure window is stopped (e.g., via a shutter, switching off the illumination source 106, or the like) and additional light is not incident on the pixels, the TDI sensor may be clocked to transfer the charge line by line to the readout row to generate an image having a length equal to the number of pixel rows.

In one embodiment, as illustrated in FIG. 1, the metrology system 100 includes a beamsplitter 128 oriented such that the objective lens 116 may simultaneously direct the illumination beam 108 to the sample 102 and collect radiation emanating from the sample 102. In this regard, the metrology system 100 may be configured in an epi-illumination mode.

In another embodiment, the angle of incidence of the illumination beam 108 on the sample 102 is adjustable. For example, the path of the illumination beam 108 through the beamsplitter 128 and the objective lens 116 may be adjusted to control the angle of incidence of the illumination beam 108 on the sample 102. In this regard, the illumination beam 108 may have a nominal path through the beamsplitter 128 and the objective lens 116 such that the illumination beam 108 has a normal incidence angle on the sample 102. By way of another example, the angle of incidence of the illumination beam 108 on the sample 102 may be controlled by modifying the position and/or angle of the illumination beam 108 on the beamsplitter 128 (e.g. by rotatable mirrors, a spatial light modulator, a free-form illumination source, or the like). In another embodiment, the illumination source 106 directs the one or more illumination beam 108 to the sample 102 at an angle (e.g. a glancing angle, a 45-degree angle, or the like).

In another embodiment, the metrology system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, metrology data (e.g. alignment measurement results, images of the sample, pupil images, and the like) or metrology metrics (e.g. precision, tool-induced shift, sensitivity, diffraction efficiency, and the like).

The one or more processors 132 of a controller 130 may include any processing element known in the art. In this sense, the one or more processors 132 may include any microprocessor-type device configured to execute algorithms and/or instructions. In one embodiment, the one or more processors 132 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 134. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the metrology system 100 or external to the metrology system 100.

The memory medium 134 may include any storage medium known in the art suitable for storing program instructions executable by the associated one or more processors 132. For example, the memory medium 134 may include a non-transitory memory medium. By way of another example, the memory medium 134 may include, but is not limited to, a read-only memory, a random access memory, a magnetic or optical memory device (e.g., disk), a magnetic tape, a solid state drive and the like. It is further noted that memory medium 134 may be housed in a common controller housing with the one or more processors 132. In one embodiment, the memory medium 134 may be located remotely with respect to the physical location of the one or more processors 132 and controller 130. For instance, the one or more processors 132 of controller 130 may access a remote memory (e.g., server), accessible through a network (e.g., internet, intranet and the like). Therefore, the above description should not be interpreted as a limitation on the present invention but merely an illustration.

In another embodiment, the controller 130 is communicatively coupled to one or more elements of the metrology system 100. In this regard, the controller 130 may transmit and/or receive data from any component of the metrology system 100. Further, the controller 130 may direct or otherwise control any component of the metrology system 100 by generating one or more drive signals for the associated components. For example, the controller 130 may be communicatively coupled to the detector 104 to receive one or more images from the detector 104. Further, the controller 130 may provide one or more drive signals to the detector 104 to carry out any of the detection techniques described herein such as, but not limited to, providing clocking signals to control exposure and/or readout windows, clocking signals to transfer charge between pixel rows of a TDI sensor, drive signals to a multi-tap sensor to direct charge to particular taps, or the like. By way of another example, the controller 130 may be communicatively coupled to any combination of components to control the optical configuration associated with an image including, but not limited to, the illumination source 106, the illumination optical components 114, the collection optical components 126, the detector 104, or the like.

Figure 2:
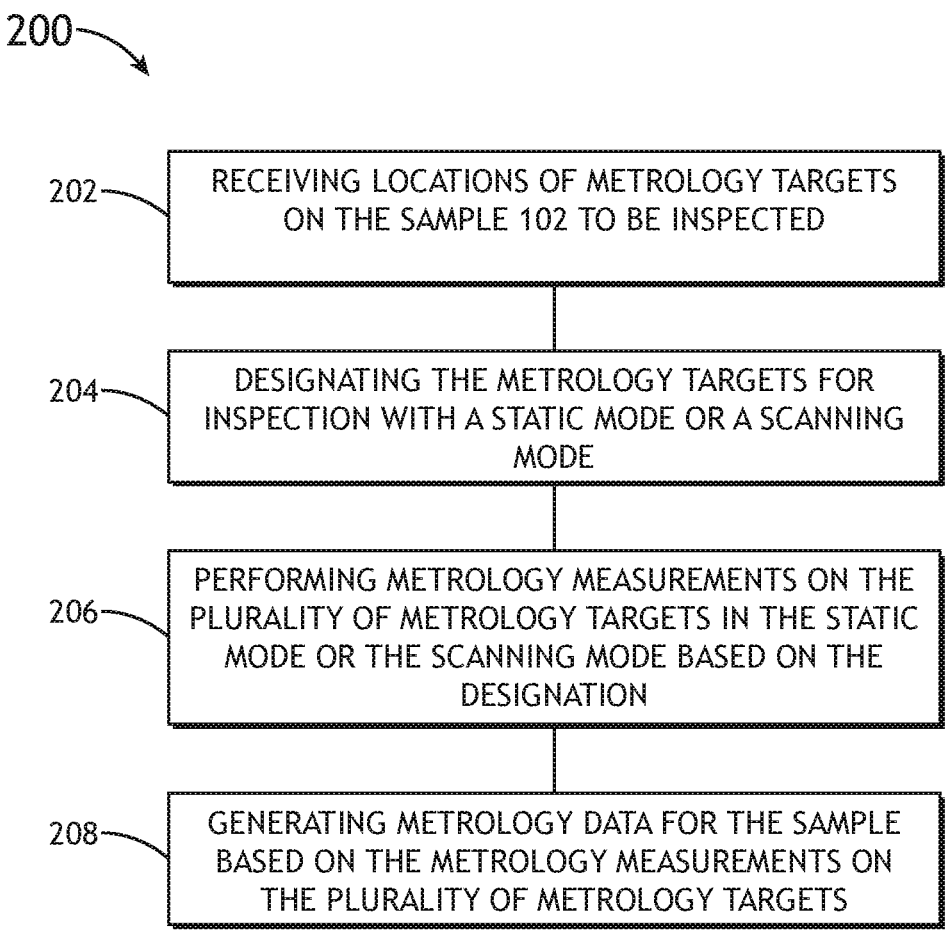
FIG. 2 is a flow diagram illustrating steps for performing a method for efficient metrology is disclosed in accordance with one or more embodiments of the present disclosure.

Referring now to FIG. 2, a flow diagram illustrating steps for performing a method 200 for efficient metrology is disclosed in accordance with one or more embodiments of the present disclosure. In particular, the method 200 may be utilized to dynamically switch between scanning and static (e.g., MAM) measurement modes to efficiently inspect metrology targets distributed across a sample 102. Applicant notes that the embodiments and enabling technologies described previously herein in the context of the metrology system 100 should be interpreted to extend to method 200. It is further noted, however, that the method 200 is not limited to the architecture of the metrology system 100.

In one embodiment, the method 200 includes a step 202 of receiving locations of metrology targets on the sample 102 to be inspected. For example, the metrology targets may be distributed at various locations across a sample 102.

Figure 3:
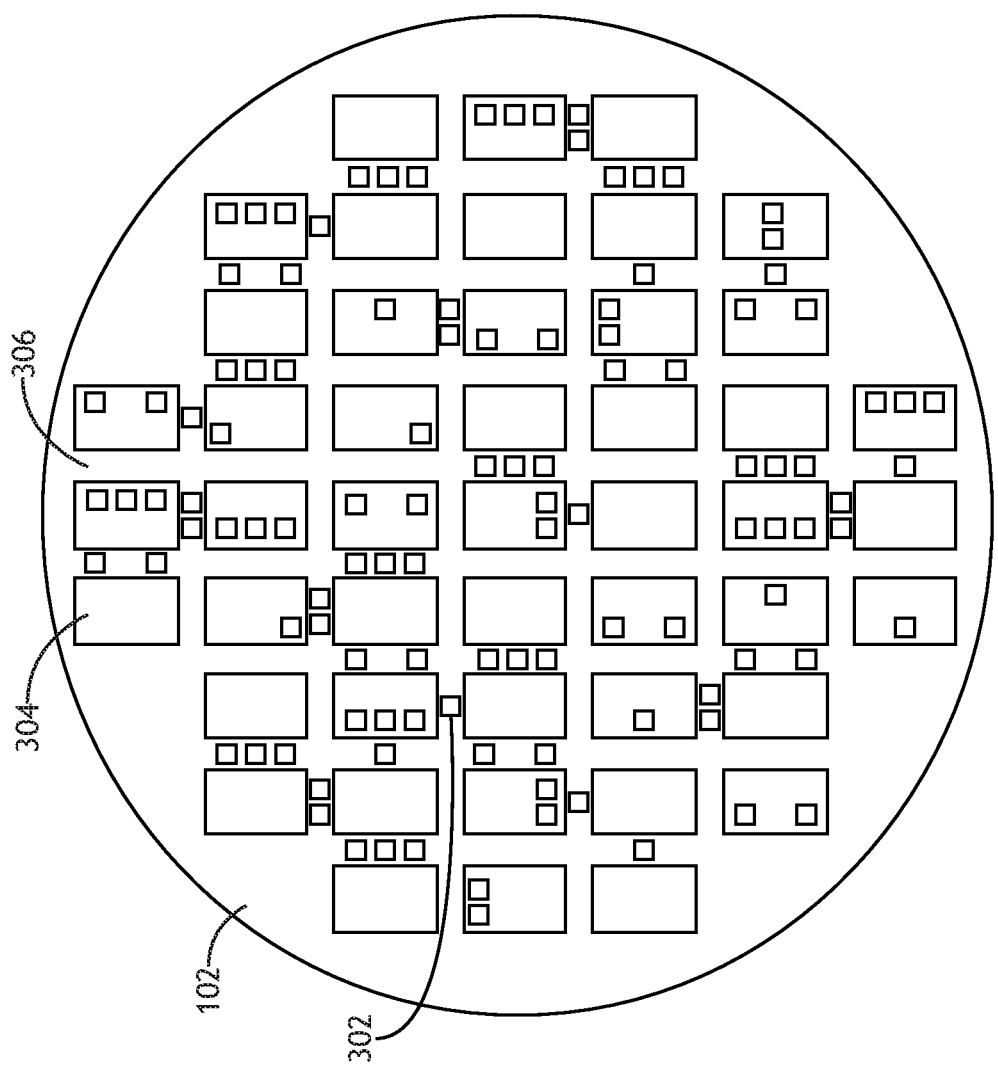
FIG. 3 is a conceptual top view of metrology targets distributed across a sample, in accordance with one or more embodiments of the present disclosure.

FIG. 3 is a conceptual top view of metrology targets 302 distributed across a sample 102, in accordance with one or more embodiments of the present disclosure. A sample 102 may include metrology targets 302 at various locations across the surface including, but not limited to, in one or more dies 304 or between adjacent dies 304 (e.g., in one or more die streets 306. Further, a given die 304 or die street 306 may include any number of metrology targets 302.

It is recognized herein that many metrology targets 302 are typically inspected across a sample to provide a representative characterization of the entire surface of the sample 102. Further, various sampling schemes may be utilized to efficiently select which of any available metrology targets 302 will be inspected on a particular sample 102 at a particular time. Accordingly, a set of locations of metrology targets on the sample 102 to be inspected received in step 202 need not include all available metrology targets 302 on a particular sample 102.

In another embodiment, the method 200 includes a step 204 of designating the metrology targets for inspection with a static mode or a scanning mode. In this regard, each (or at least some) of the metrology targets 302 to be inspected on a sample 102 may be designated or otherwise sorted for inspection using either a static mode or a scanning mode. In another embodiment, the step 204 includes separating at least some of the metrology targets 302 designated for inspection with the scanning mode into one or more scanning groups. For example, a scanning group may include two or more metrology targets 302 to be inspected in a common scan of the metrology system 100.

The measurement mode for each particular metrology target 302 may be determined based on any selected metric or combination of metrics.

In one embodiment, the measurement mode and/or scanning group is selected based on a target type. In general, a sample 102 may include multiple types of metrology targets 302. For instance, a sample 102 may include, but is not limited to, overlay metrology targets 302, critical dimension metrology targets 302, or SWA metrology targets 302, where each type of metrology target 302 has a different arrangement of features on one or more layers of the sample 102 (e.g., different target designs). In another instance, a sample 102 may include multiple metrology targets 302 configured to generate similar metrology data (e.g., overlay, CD, SWA, or the like), but with different designs. Accordingly, it may be the case that some target designs are better suited for a particular measurement mode (e.g., static or scanning mode). In this regard, the step 204 may include designating the measurement mode for a particular metrology target 302 based on the target type.

In another embodiment, the measurement mode and/or scanning group is selected based on a target density and/or proximity of neighboring metrology targets 302. For example, it may be more efficient to inspect multiple adjacent metrology targets 302 in one or more scans (e.g., swaths) in a scanning mode to avoid lengthy acceleration, deceleration, and settling times associated with a static measurement. By way of another example, it may be more efficient to inspect irregularly and/or sparsely distributed metrology targets 302 using a static mode. In particular, in the case that multiple metrology targets 302 cannot be inspected using common scans having a reasonable length, the associated time of performing separate scans for individual targets may be less efficient than a static measurement.

In another embodiment, the measurement mode and/or scanning group is selected based on a target location. It may be the case that certain areas of a sample 102 are better suited for measurement using a particular measurement mode. For example, multiple metrology targets 302 aligned along a narrow die street 306 may be efficiently measured in one or more scans in a scanning mode. By way of another example, metrology targets 302 dispersed within one or more dies 304 may be efficiently measured in a static mode.

The step 204 of designating the metrology targets for inspection with a static mode or a scanning mode may be performed locally on a particular metrology tool or remotely. For example, in the case that the step 204 is performed remotely, the locations of the metrology targets 302 (e.g., associated with step 202) and the associated designated measurement mode (e.g., associated with step 204) may be located in a sampling recipe (e.g., a sampling plan) received by the metrology tool.

In another embodiment, the method 200 includes a step 206 of performing metrology measurements on the plurality of metrology targets in the static mode or the scanning mode based on the designation.

The metrology tool may include any type of metrology tool known in the art suitable for performing both static and scanning mode measurements.

In one embodiment, the metrology tool includes a TDI sensor (e.g., a detector 104). In this regard, the metrology tool may perform a scanning mode measurement by exposing the sample 102 with illumination from an illumination source (e.g., the illumination source 106) during an exposure window, synchronizing the TDI sensor with motion of the sample during the exposure window, and generating an image row by row during the motion of the sample 102.

In another embodiment, the metrology tool may perform a static mode measurement by exposing the sample during the exposure window with the illumination from the illumination source while the sample is static without clocking the TDI sensor to transfer charge, and clocking the TDI sensor to transfer charge row by row to generate an image when the sample is not exposed to the illumination from the illumination source.

In another embodiment, the metrology tool may perform a static mode measurement by exposing the sample during the exposure window with the illumination from the illumination source while the sample is static, and reading out an image of the sample with the imaging detector after the exposure window.

In another embodiment, the method 200 includes a step 208 of generating metrology data for the sample based on the metrology measurements on the plurality of metrology targets. For example, the step 208 may include generating any type of metrology data based on the inspected metrology targets 302 including, but not limited to, overlay metrology data, CD metrology data, or SWA metrology data.

Figure 4:
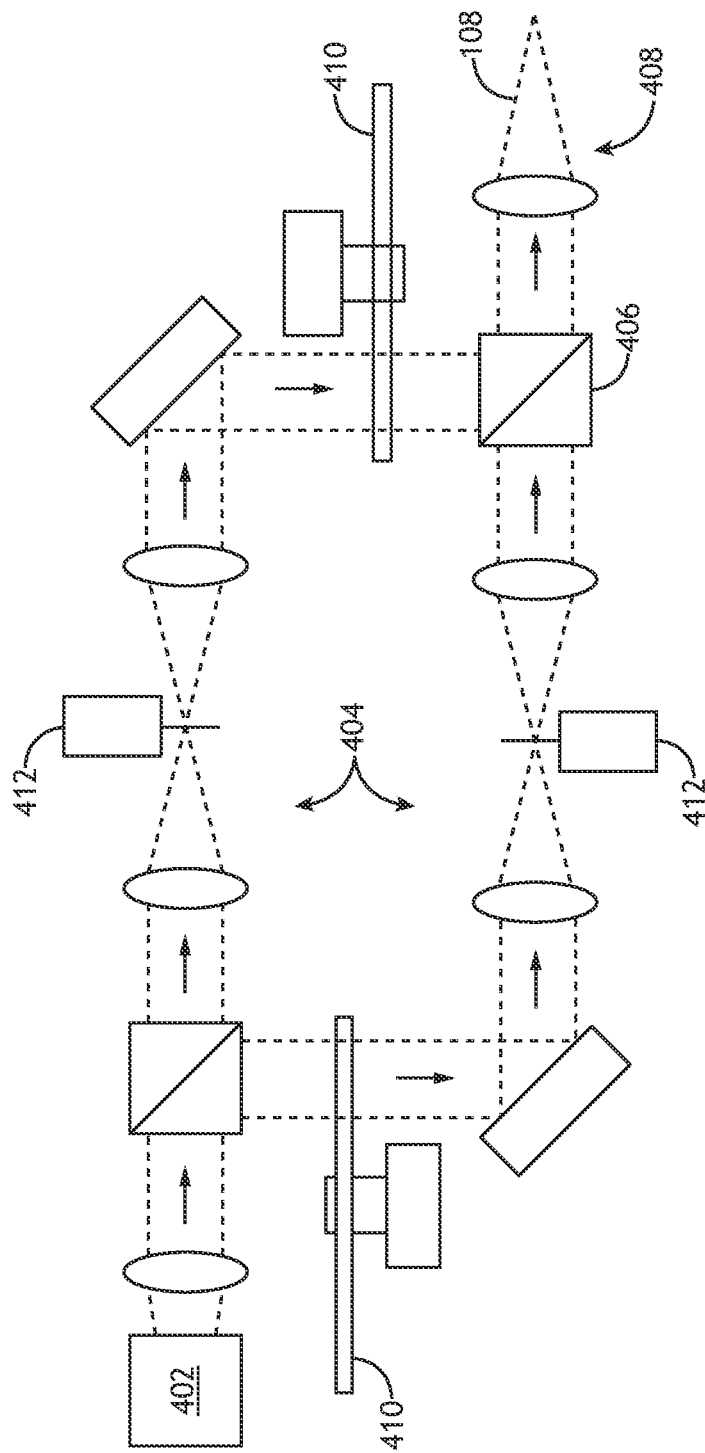
FIG. 4 is conceptual view of a multi-channel illumination source configured to sequentially generate illumination having two or more optical configurations along a common optical column, in accordance with one or more embodiments of the present disclosure.
Figure 5A:
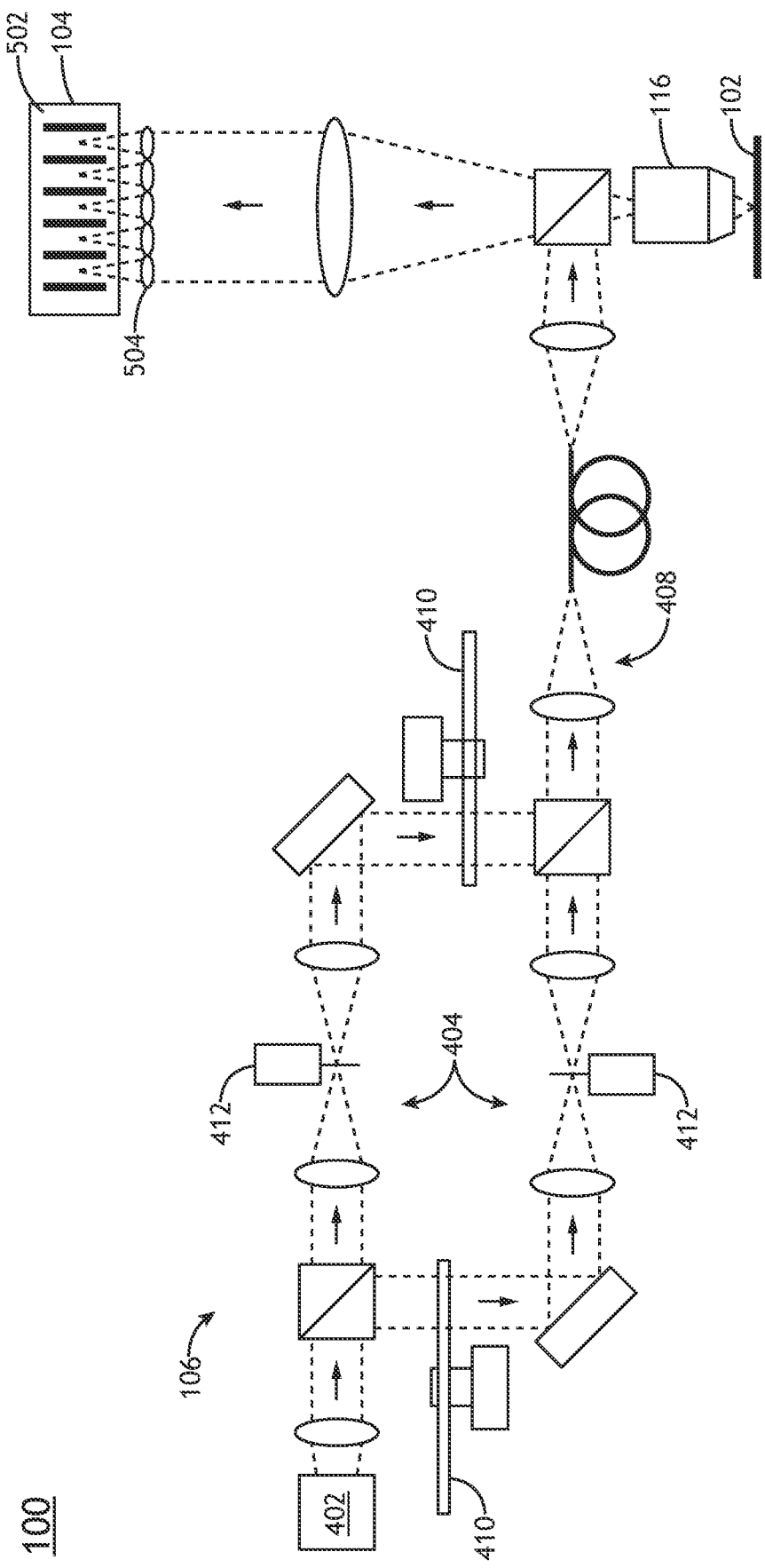
FIG. 5A is a conceptual view of a metrology system including a TDI sensor suitable for capturing an interleaved output image associated with two alternating optical configurations, in accordance with one or more embodiments of the present disclosure.
Figure 5B:
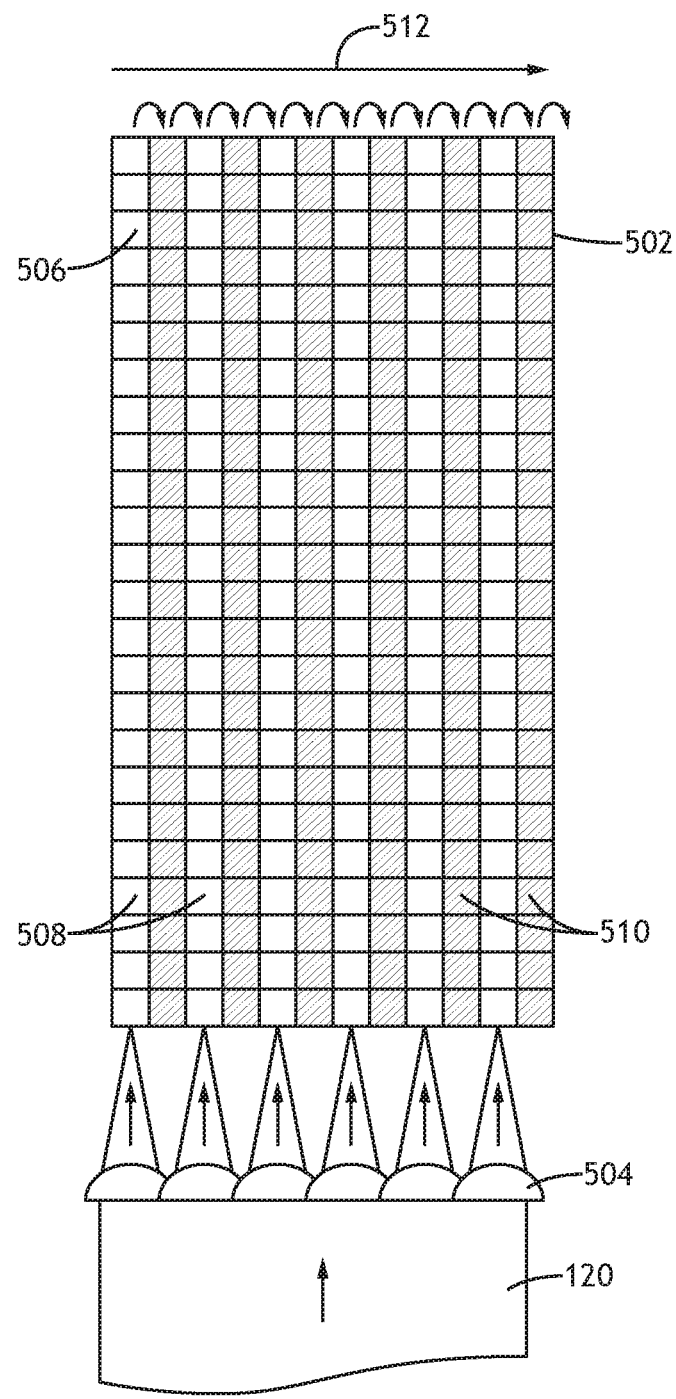
FIG. 5B is a conceptual view of a portion of the collection pathway of the metrology system of FIG. 5A illustrating charge transfer, in accordance with one or more embodiments of the present disclosure.

Referring now to FIGS. 4 through 5B, systems and methods for high-sensitivity metrology measurements are described in greater detail in accordance with one or more embodiments of the present disclosure.

As described previously herein, in some embodiments, a metrology system 100 generates multiple images of a sample with different optical configurations in a single exposure window of a detector 104. The images may include any combination of field-plane and pupil-plane images. Further, the multiple images may be generated in a static mode and/or a scanning mode. In this regard, a metrology system 100 may provide both dynamic selection of static or scanning mode measurements (e.g., as shown in FIG. 2) and multiple images of the sample with different optical configurations in a single exposure window in any of the static or scanning modes. However, it is recognized herein that a metrology system 100 may be configured exclusively for static and/or scanning mode operation within the spirit and scope of the present disclosure.

The metrology system 100 may generate alternating optical configurations for imaging the sample 102 using any technique known in the art.

In one embodiment, the metrology system 100 may adjust one or more components in the illumination pathway 110 to generate the multiple optical configurations.

For example, the illumination source 106 may be configured as a multi-channel illumination source to sequentially generate illumination having two or more optical configurations. In some embodiments, the controller 130 may be communicatively coupled to any combination of components in the metrology system 100 and may control the components (e.g., via drive signals) to provide the multiple optical configurations.

FIG. 4 is conceptual view of a multi-channel illumination source 106 configured to sequentially generate illumination having two or more optical configurations along a common optical column, in accordance with one or more embodiments of the present disclosure.

In one embodiment, the illumination source 106 includes a broadband light source 402, two or more channels 404 having different optical paths, and a beam combiner 406 to combine light from the channels 404 into a common optical column 408. Further, any channel 404 may include separate components to provide separately tunable optical profiles. For example, any channel 404 may include a spectral filter 410 to pass a selected portion of the spectrum of the illumination from the broadband light source 402, a shutter 412, one or more neutral density filters, one or more apertures (e.g., functioning as field or aperture stops), or one or more polarizers.

In another embodiment, though not shown, the multi-channel illumination source 106 may include one or more tunable optical elements (e.g., tunable spectral filters, shutters, apertures, polarizers, or the like) along a single common optical column 408.

In another embodiment, the metrology system 100 may adjust one or more components of the collection pathway 122 to generate the multiple optical configurations. For example, the metrology system 100 may adjust (e.g., via the controller 130) one or more spectral filters, one or more shutters, one or more neutral density filters, one or more apertures, or one or more polarizers in the collection pathway 122 to generate the multiple optical configurations. By way of another example, the metrology system 100 may adjust one or more parameters of the detector 104 such as, but not limited to the gain or the exposure window (e.g., the integration time) to generate the multiple optical configurations.

The metrology system 100 may include any type of detector 104 suitable for generating multiple images associated with the different optical configurations within a single exposure window of the detector 104. The multiple images may be interleaved into a common output image by the detector 104 and subsequently separated or they may be directly generated during a readout phase.

FIG. 5A is a conceptual view of a metrology system 100 including a TDI sensor 502 (e.g., as the detector 104) suitable for capturing an interleaved output image associated with two alternating optical configurations, in accordance with one or more embodiments of the present disclosure. FIG. 5B is a conceptual view of a portion of the collection pathway 122 of the metrology system 100 of FIG. 5A illustrating charge transfer, in accordance with one or more embodiments of the present disclosure.

In one embodiment, the metrology system 100 includes a cylindrical lens array 504 in the collection pathway 122 to focus light from the sample 102 (e.g., sample light 120) onto alternating pixel rows 506 of the TDI sensor 502. In this regard, the metrology system 100 may be configured to only expose a set 508 of pixel rows 506 (e.g., alternating pixel rows 506). The remaining set 510 of pixel rows 506 remains unilluminated.

In another embodiment, the metrology system 100 includes a slit array (not shown) to block the non-illuminated set 510 of pixel rows 506. The slit array may be placed at any location suitable for blocking the non-illuminated set 510 of pixel rows 506. For example, the slit array may be placed on or otherwise integrated within the TDI sensor 502. By way of another example, the slit array may be located in a field plane of the collection pathway 122. Further, it is contemplated herein that the metrology system 100 may include a slit array instead of or in addition to a cylindrical lens array 504.

The metrology system 100 may then perform a scanning mode measurement by synchronizing a charge transfer rate of the TDI sensor 502 and the motion of the sample 102 along a scan direction 512 as in a typical TDI setup, but alternately generating images with two different optical configurations at the clocking rate of the TDI sensor 502. In this regard, the TDI sensor 502 may generate an interleaved output image associated with a single exposure window. The interleaved output image may then be split (e.g., by the controller 130) into separate images associated with the different optical configurations. In particular, a sequence for forming the interleaved output image may be, but is not required to be, as follows. First, the metrology system 100 is configured to image the sample 102 with a first optical configuration, where the sample light 120 is focused to the set 508 of illuminated pixel rows 506. Second, the TDI sensor 502 is clocked to transfer charge associated with the first optical configuration out of the set 508 of illuminated pixel rows 506. At the same time, the metrology system 100 is configured to image the sample 102 with a second optical configuration, where the sample light 120 is again focused to the set 508 of illuminated pixel rows 506. Third, the TDI sensor 502 is clocked again to transfer the charge associated with the first optical configuration back to the set 508 of illuminated pixel rows 506. Because the charge transfer rate and the motion of the sample 102 are synchronized, charge associated with the first optical configuration may accumulate in the set 508 of illuminated pixel rows 506 as typically occurs in TDI operation. This process then repeats such that the alternating rows of the output image correspond to the first and second optical configurations, respectively. These alternating rows may then be split to form two separate images associated with the first and second optical configurations, respectively. Further, it is noted that the two images may be spatially shifted by half of a pixel pitch along the scan direction.

It is to be understood, however, that FIG. 5 and the associated description are provided solely for illustrative purposes and should not be interpreted as limiting. For example, FIG. 5 and the associated description describe a configuration in which a cylindrical lens array 504 focuses sample light 120 on alternating pixel rows 506 to generate an interleaved output image associated with two optical configurations. However, the approach described herein may be extended to any number of optical configurations (e.g., N optical configurations, where N is an integer greater than one). For example, the approach may be extended to support N optical configurations by illuminating every Nth pixel row 506 using any combination of a cylindrical lens array 504 or a slit array and sequentially cycling through the N optical configurations at the TDI clocking rate during an exposure window of the detector 104.

In another embodiment, as described previously herein, the metrology system 100 may include a detector 104 configured as a multi-tap imaging sensor. In this regard, charge in each pixel may be directed to any selected tap during an exposure window based on one or more drive signals to the pixel. A multi-tap sensor including an array of multi-tap pixels may generate multiple images, each associated with different taps of the associated pixels, during a single readout phase. Accordingly, the metrology system 100 may perform a static mode measurement by sequentially providing any selected number of optical configurations (e.g., N optical configurations) during the exposure window while the sample 102 is static. Further, the controller 130 may be communicatively coupled to the pixels in the multi-tap sensor and may generate drive signals to direct the charge from each optical configuration into a different tap during the exposure window. Then, the metrology system 100 may read out the N images from the two or more taps during a readout phase, where the N images correspond to the N optical configurations.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
a metrology tool configured to selectively perform metrology measurements in a static mode in which one or more metrology targets on a sample are stationary during a measurement or a scanning mode in which one or more metrology targets are in motion during a measurement, wherein the metrology tool comprises a time delay integration (TDI) sensor including multiple pixel rows and a multi-channel imaging sub-system configured to sequentially provide N optical configurations for imaging a sample in an exposure window of a detector and generate N images of the sample during a readout phase of the detector associated with the exposure window, wherein N is an integer greater than one, wherein a particular image of the N images corresponds to a particular optical configuration of the N optical configurations, wherein one or more optics of the multi-channel imaging sub-system comprise a cylindrical lens array configured to direct the light emanating from the sample to every Nth pixel row of the TDI sensor,
wherein the metrology tool is configured to perform a scanning mode measurement by:
translating the sample at a charge transfer rate of the TDI sensor along a scan direction perpendicular to the pixel rows;
sequentially providing the N optical configurations for imaging the sample, wherein a switching time between successive optical configurations of the multi-channel imaging sub-system corresponds to the charge transfer rate of the TDI sensor;
generating, with the TDI sensor, an interleaved image including the N images during the exposure window; and
separating the interleaved image into the N images; and
a controller communicatively coupled to the translation stage and the TDI sensor, the controller including one or more processors configured to execute program instructions causing the one or more processors to:
receive locations of a plurality of metrology targets on the sample to be inspected;
designate the plurality of metrology targets for inspection with the static mode or the scanning mode;
direct the metrology tool to perform metrology measurements on the plurality of metrology targets in the static mode or the scanning mode based on the designation; and
generate metrology data for the sample based on the metrology measurements on the plurality of metrology targets.

2. The metrology system of claim 1, wherein the one or more processors are configured to designate the plurality of metrology targets for inspection with the static mode or the scanning mode based on at least one of target type, target location, a proximity to one or more additional metrology targets of the plurality of metrology targets, or target density.

3. The metrology system of claim 1, wherein the one or more processors are configured to separate at least some of the plurality of metrology targets designated for inspection with the scanning mode into one or more scanning groups, wherein a particular scanning group of the one or more scanning groups includes at least two of the plurality of metrology targets to be measured in a common scan by the metrology tool.

4. The metrology system of claim 3, wherein the one or more processors are configured to separate at least some of the plurality of metrology targets designated for inspection with the scanning mode into one or more scanning groups based on at least one of target density along a scan direction.

5. The metrology system of claim 1, wherein the metrology tool is configured to perform a scanning mode measurement by:
exposing the sample with illumination from an illumination source during an exposure window;
synchronizing the TDI sensor with motion of the sample during the exposure window; and
generating an image row by row during the motion of the sample.

6. The metrology system of claim 5, wherein the metrology tool is configured to perform a static mode measurement by:
exposing the sample during the exposure window with the illumination from the illumination source while the sample is static without clocking the TDI sensor to transfer charge; and
clocking the TDI sensor to transfer charge row by row to generate an image when the sample is not exposed to the illumination from the illumination source.

7. The metrology system of claim 5, wherein the metrology tool further includes an imaging detector; wherein the metrology tool is configured to perform a static mode measurement by:
exposing the sample during the exposure window with the illumination from the illumination source while the sample is static; and
reading out an image of the sample with the imaging detector after the exposure window.

8. The metrology system of claim 1, wherein the one or more optics comprise a slit array positioned to block pixel rows of the TDI sensor not illuminated by the cylindrical lens array.

9. The metrology system of claim 1, wherein the one or more optics comprise a slit array positioned to pass light to every Nth pixel row of the TDI sensor and block remaining pixel rows of the TDI sensor, wherein the metrology tool is configured to perform a scanning mode measurement by:
translating the sample at a charge transfer rate of the TDI sensor along a scan direction perpendicular to the pixel rows;
sequentially providing the N optical configurations for imaging the sample, wherein a switching time between successive optical configurations of the multi-channel imaging sub-system corresponds to the charge transfer rate of the TDI sensor;
generating, with the TDI sensor, an interleaved image including the N images during the exposure window; and
separating the interleaved image into the N images.

10. The metrology system of claim 1, wherein the TDI sensor further comprises:
a multi-tap imaging sensor for static mode measurements, the multi-tap imaging sensor having two or more taps, wherein the metrology tool is configured to perform a static mode measurement by:
sequentially providing the N optical configurations for imaging the sample when the sample is static, wherein the multi-tap imaging sensor is synchronized to the multi-channel illumination source such that a different tap of the two or more taps receives charge for each of the N optical configurations during the exposure window; and reading out the N images from the multi-tap imaging sensor during a readout phase.

11. A metrology method comprising:

receiving, with one or more processors, locations of a plurality of metrology targets on a sample to be inspected;

designating, with one or more processors, the plurality of metrology targets for inspection with a static mode in which one or more metrology targets on the sample are stationary during a measurement or a scanning mode in which one or more metrology targets are in motion during a measurement;

directing, with one or more processors, a metrology tool to perform metrology measurements on the plurality of metrology targets in the static mode or the scanning mode based on the designation via one or more drive signals, wherein the metrology tool comprises a time delay integration (TDI) sensor including multiple pixel rows, wherein a sample stage is configured to translate the sample along a scan direction perpendicular to the pixel rows at a charge transfer rate of the TDI sensor, wherein a switching time between successive N optical configurations of the multi-channel imaging sub-system corresponds to the charge transfer rate of the TDI sensor; and generating, with one or more processors, metrology data for the sample based on the metrology measurements on the plurality of metrology targets.

12. A metrology system comprising:

a multi-channel imaging sub-system comprising:
an illumination source;
one or more illumination optics configured to direct illumination from the illumination source to a sample;
one or more collection optics configured to collect light emanating from the sample in response to the illumination from the illumination source; and
a detector configured to generate two or more images of the sample in an exposure window, wherein the detector comprises a time delay integration (TDI) sensor including multiple pixel rows, wherein a sample stage is configured to translate the sample along a scan direction perpendicular to the pixel rows at a charge transfer rate of the TDI sensor, wherein a switching time between successive N optical configurations of the multi-channel imaging sub-system corresponds to the charge transfer rate of the TDI sensor; and a controller communicatively coupled to the detector, the controller including one or more processors configured to execute program instructions causing the one or more processors to:

generate one or more drive signals for at least one of the illumination source, the one or more illumination optics, the one or more collection optics, or the detector to sequentially cycle through N optical configurations of the multi-channel imaging sub-system within the exposure window of the detector, wherein N is an integer greater than one, wherein the detector generates N images of the sample during a readout phase associated with the exposure window, wherein a particular image of the N images corresponds to a particular optical configuration of the N optical configurations; and generate metrology data associated with the sample based on the N images of the sample.

13. The metrology system of claim 12, wherein the one or more collection optics comprise a cylindrical lens array configured to direct the light emanating from the sample to every Nth pixel row of the TDI sensor, wherein the TDI sensor generates an interleaved image containing the N images during the readout phase associated with the exposure window.

14. The metrology system of claim 13, wherein the one or more collection optics comprise a slit array positioned to block pixel rows of the TDI sensor not illuminated by the cylindrical lens array.

15. The metrology system of claim 12, wherein the one or more collection optics comprise a slit array positioned to pass light to every Nth pixel row of the TDI sensor and block remaining pixel rows of the TDI sensor, wherein the TDI sensor generates an interleaved image containing the N images during the readout phase associated with the exposure window.

16. The metrology system of claim 15, wherein the slit array is positioned on the TDI sensor.

17. The metrology system of claim 15, wherein the slit array is positioned in a field plane of the metrology system.

18. The metrology system of claim 12, wherein the one or more collection optics comprise a slit array positioned to block pixel rows of the TDI sensor not illuminated by the cylindrical lens array.

19. The metrology system of claim 12, wherein the detector comprises:

a multi-tap imaging sensor having two or more taps suitable for generating at least N images in the exposure window, wherein the multi-tap imaging sensor is synchronized to the multi-channel illumination source such that the multi-tap imaging sensor generates a separate image associated with each of the N optical configurations during the exposure window.

20. The metrology system of claim 12, wherein a particular optical configuration of the N optical configurations comprises:

a spectrum of illumination.

21. The metrology system of claim 20, wherein the multi-channel illumination source comprises:

a broadband light source; and
at least one spectral filter.

22. The metrology system of claim 21, wherein the at least one spectral filter is tunable.

23. The metrology system of claim 20, wherein the multi-channel illumination source comprises:

two or more illumination sources having different spectra.

24. The metrology system of claim 12, wherein the multi-channel illumination source includes at least one spectral filter, wherein a particular optical configuration of the N optical configurations comprises:

a spectrum of illumination.

25. The metrology system of claim 12, wherein the multi-channel illumination source includes at least one polarizer, wherein a particular optical configuration of the N optical configurations comprises:

a polarization of illumination.

26. The metrology system of claim 12, wherein the multi-channel illumination source includes a variable lens, wherein a particular optical configuration of the N configurations comprises:

a location of an imaging plane with respect to a surface of the sample.

27. The metrology system of claim 26, wherein the variable lens comprises:

at least one of a variable-focus lens or a translation stage configured to adjust a position of a lens.

28. The metrology system of claim 12, wherein the multi-channel illumination source comprises:

two or more channels having different optical paths, wherein each of the two or more channels includes one or more optical components to provide illumination having a particular optical configuration of the N optical configurations.

29. The metrology system of claim 28, wherein the multi-channel illumination source further comprises:

a beam combiner to route illumination in each of the two or more channels to a single common optical column, wherein the two or more channels have different optical paths prior to entry into the single common optical column; and one or more shutters to selectively block illumination in at least one of the two or more channels from reaching the common optical column.

30. The metrology system of claim 29, wherein the one or more shutters comprise:

at least one of a mechanical shutter, an electro-optic shutter, or an acousto-optic shutter.

31. The metrology system of claim 12, wherein a particular optical configuration of the N optical configurations comprises:

an imaging configuration of the detector.

32. The metrology system of claim 31, wherein the imaging configuration of the detector comprises:

at least one of a gain or an exposure time.

* * * * *